(12) United States Patent
Komada et al.

(10) Patent No.: US 10,992,103 B1
(45) Date of Patent: Apr. 27, 2021

(54) LASER DEVICE

(71) Applicant: Sharp Fukuyama Laser Co., Ltd., Hiroshima (JP)

(72) Inventors: Satoshi Komada, Fukuyama (JP); Keisuke Miyazaki, Fukuyama (JP); Takashi Ono, Fukuyama (JP); Tetsuya Fujitani, Fukuyama (JP)

(73) Assignee: Sharp Fukuyama Laser Co., Ltd., Fukuyama (JP)

(*) Notice: Subject to any disclaimer, the term of this patent is extended or adjusted under 35 U.S.C. 154(b) by 2 days.

(21) Appl. No.: 16/700,827

(22) Filed: Dec. 2, 2019

(51) Int. Cl.
*H01S 3/13* (2006.01)
*H01S 5/02326* (2021.01)
*H01S 5/183* (2006.01)
*H01S 5/0236* (2021.01)
*H01S 5/024* (2006.01)
*H01S 5/40* (2006.01)
*H01S 5/0222* (2021.01)
*H01S 5/323* (2006.01)

(52) U.S. Cl.
CPC ........ *H01S 5/02326* (2021.01); *H01S 5/0222* (2013.01); *H01S 5/0236* (2021.01); *H01S 5/02469* (2013.01); *H01S 5/1838* (2013.01); *H01S 5/18397* (2013.01); *H01S 5/4025* (2013.01); *H01S 5/4075* (2013.01); *H01S 5/323* (2013.01); *H01S 5/4093* (2013.01)

(58) Field of Classification Search
CPC .... H01S 5/4093; H01S 5/4075; H01S 5/4025; H01S 5/0222; H01S 5/0236; H01S 5/02469; H01S 5/02326; H01S 5/323
See application file for complete search history.

(56) References Cited

U.S. PATENT DOCUMENTS

| | | | | |
|---|---|---|---|---|
| 6,377,592 | B1* | 4/2002 | Auracher | H01S 5/0687 372/9 |
| 8,897,327 | B2* | 11/2014 | Auen | H01S 5/02257 372/34 |
| 2003/0053498 | A1* | 3/2003 | Hamasaki | H01S 5/02255 372/36 |
| 2005/0226636 | A1* | 10/2005 | Hiramatsu | H01S 5/02234 398/182 |
| 2010/0246624 | A1* | 9/2010 | Hiroyama | H01S 5/320275 372/45.01 |

(Continued)

FOREIGN PATENT DOCUMENTS

| | | |
|---|---|---|
| JP | 2003-188454 A | 7/2003 |
| JP | 2012-059898 A | 3/2012 |
| JP | 2017-069241 A | 4/2017 |

*Primary Examiner* — Kinam Park
(74) *Attorney, Agent, or Firm* — ScienBiziP, P.C.

(57) ABSTRACT

A laser device includes a substrate including a principal surface and a recess provided in the principal surface; a laser oscillation unit fixed to the principal surface in direct contact with the principal surface or with an adhesive interposed between the laser oscillation unit and the principal surface, the laser oscillation unit having an emission surface from which laser light that diverges as the laser light travels is emitted along the principal surface; and a reflecting member fixed to a bottom surface of the recess and having an inclined surface that is inclined with respect to the principal surface so as to reflect the laser light. At least a portion of the inclined surface is positioned in a space inside the recess.

13 Claims, 5 Drawing Sheets

(56) References Cited

U.S. PATENT DOCUMENTS

2016/0011385 A1* 1/2016 Kossat ................ G02B 6/4239
                                                           385/14
2016/0285234 A1* 9/2016 Okahisa ............. H01S 5/02255
2019/0097381 A1* 3/2019 Miyata ..................... F21V 7/05
2019/0386192 A1* 12/2019 Kozuru ................ H01S 5/0222

* cited by examiner

LASER DEVICE

BACKGROUND

1. Field

The present disclosure relates to a laser device.

2. Description of the Related Art

In recent years, as disclosed in U.S. Pat. No. 8,897,327 (Patent Document 1), Japanese Unexamined Patent Application Publication No. 2012-59898 (Patent Document 2), Japanese Unexamined Patent Application Publication No. 2017-69241 (Patent Document 3), and Japanese Unexamined Patent Application Publication No. 2003-188454 (Patent Document 4), laser devices that emit laser light from laser oscillation units have been developed.

For example, a laser device illustrated in FIG. 2 of Patent Document 1 includes a substrate (housing 10) and a sub-mount (heat conducting element 3) provided on a principal surface of the substrate. As disclosed in Patent Document 1, the laser device includes a laser oscillation unit (laser diode chip 1) fixed to the sub-mount and having an emission surface from which laser light is emitted along the principal surface. The laser device includes a reflecting member (optical deflection element 2) having an inclined surface that obliquely extends at a position such that the inclined surface reflects the laser light.

In the above-described laser device, the laser light diverges as it travels along the principal surface of the substrate. Therefore, when the emission surface of the laser oscillation unit is too close to the principal surface of the substrate, there is a risk that a portion of the laser light will reach the principal surface of the substrate. For this reason, the emission surface of the laser oscillation unit is not to be disposed too close to the principal surface of the substrate.

If, for example, the sub-mount (heat conducting element 3) is removed and the laser oscillation unit is placed on the principal surface of the substrate, a portion of the laser light emitted from the laser oscillation unit along the substrate may reach the principal surface of the substrate. In this case, the energy of the laser light is reduced and the far-field pattern of the laser light is distorted when a portion of the laser light reaches the principal surface of the substrate. As a result, the laser light emission efficiency is reduced.

When the sub-mount is present between the substrate and the laser oscillation unit, it is difficult to efficiently transmit heat generated by the laser oscillation unit to the substrate. As a result, the laser light emission efficiency is reduced due to the generated heat.

SUMMARY

The present disclosure has been made in light of the above-described problems. It is desirable to provide a laser device with improved laser light emission efficiency.

According to an aspect of the disclosure, there is provided a laser device including a substrate including a principal surface and a recess provided in the principal surface; a laser oscillation unit fixed to the principal surface in direct contact with the principal surface or with an adhesive interposed between the laser oscillation unit and the principal surface, the laser oscillation unit having an emission surface from which laser light is emitted along the principal surface; and a reflecting member fixed to a bottom surface of the recess and having an inclined surface that is inclined with respect to the principal surface at a position such that the inclined surface reflects the laser light. At least a portion of the inclined surface is positioned in a space inside the recess.

DESCRIPTION OF THE EMBODIMENTS

Figure 1:
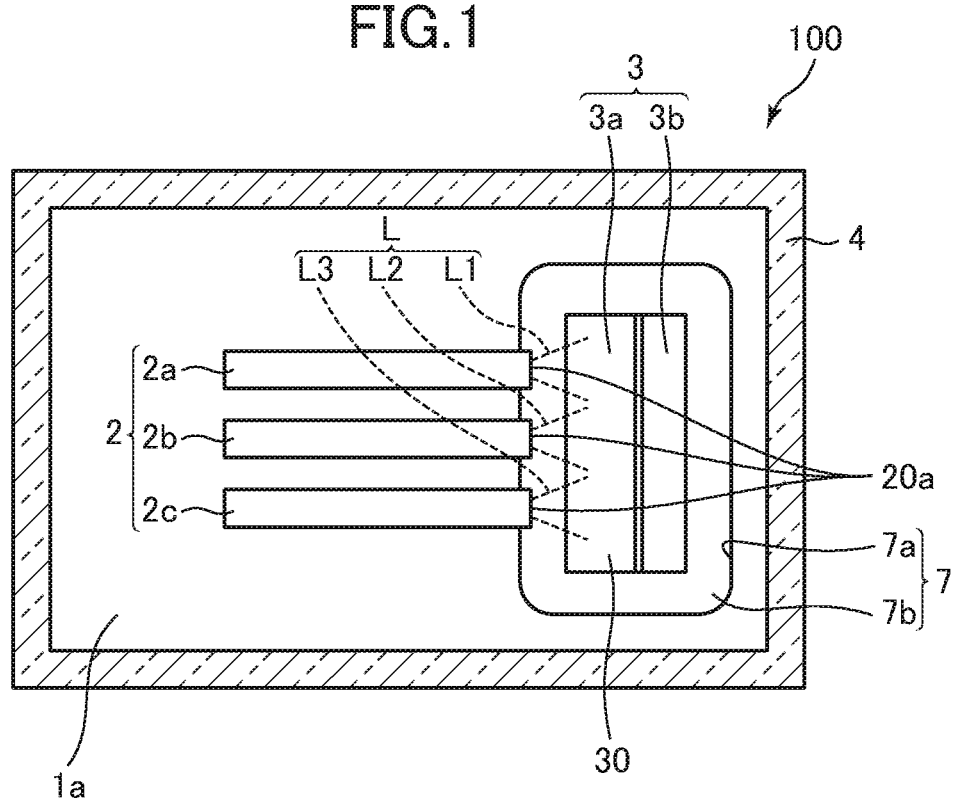
FIG. 1 is a horizontal sectional view of a laser device according to a first embodiment.

Laser devices according to embodiments of the present disclosure will now be described with reference to the drawings. In the drawings, the same structures are denoted by the same reference symbols. In the embodiments, description of the same structures is basically not repeated.

The laser devices according to the embodiments may be used as, for example, a light source for optical communication or various types of image display devices, such as a projector, a head-up display, or a laser television set. The laser devices according to the embodiments may instead be used as a light source for various types of illumination devices, such as a head light, a garden light, or an indoor illumination light. In each embodiment, semiconductor laser elements are used as laser elements included in the light source. However, laser elements other than semiconductor laser elements may instead be used in each embodiment.

First Embodiment

A laser device 100 according to a first embodiment will be described with reference to FIGS. 1 and 2.

Figure 2:
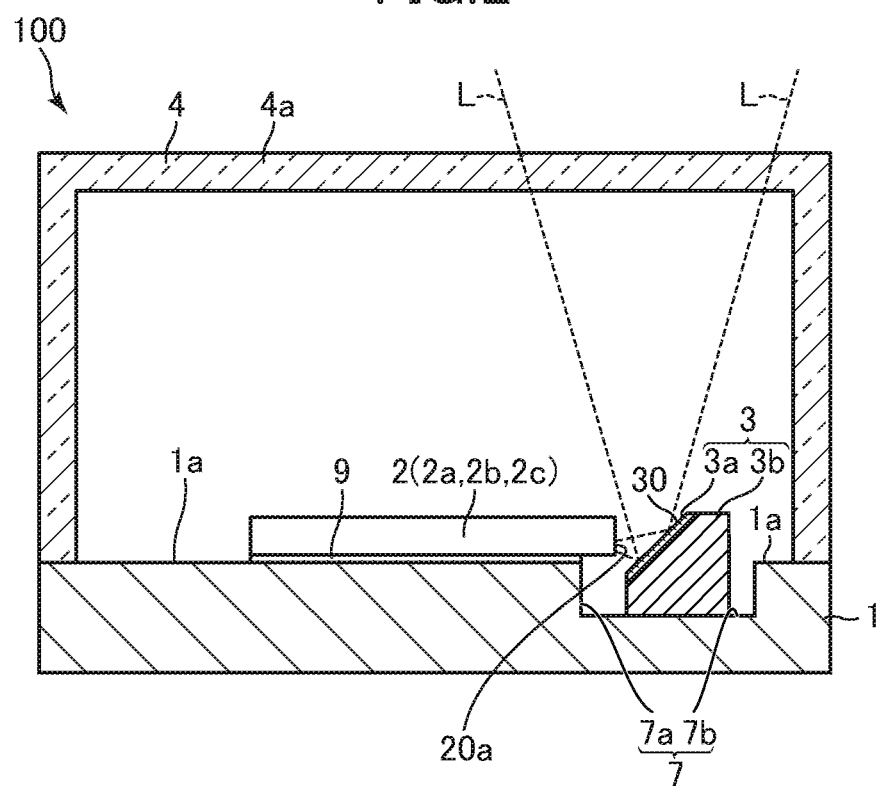
FIG. 2 is a vertical sectional view of the laser device according to the first embodiment.

As illustrated in FIGS. 1 and 2, the laser device 100 according to the first embodiment includes a substrate 1, a laser oscillation unit 2, a reflecting member 3, and a cover member 4.

The substrate 1 has the shape of a plate having a certain thickness and a rectangular outline in a plan view. The substrate 1 has a principal surface 1a and a recess 7 provided in the principal surface 1a. The principal surface 1a of the substrate 1 faces a space inside the laser device 100.

The laser oscillation unit 2 includes a plurality of laser elements 2a, 2b, and 2c. The laser elements 2a, 2b, and 2c each have the outer shape of a thin long rectangular rod that extends in one direction. In the present embodiment, each of the laser elements 2a, 2b, and 2c is fixed to the principal surface 1a of the substrate 1 with an adhesive 9 interposed therebetween.

The adhesive 9 is disposed between the bottom surface of each of the laser elements 2a, 2b, and 2c and the top surface of the substrate 1. The adhesive 9 has a thickness less than a thickness of a sub-mount, and contains AuSn, which has a thermal conductivity higher than a thermal conductivity of the sub-mount, as a main component thereof. Therefore, the efficiency of transmission of heat generated by the laser oscillation unit 2 to the substrate 1 is higher than that when a layer, such as the sub-mount, is present between the laser oscillation unit 2 and the substrate 1. As a result, the heat dissipation performance of the laser device 100 can be improved.

The laser oscillation unit 2 has emission surfaces 20a at an end facing the reflecting member 3, which will be described below. The emission surfaces 20a emit laser light L toward an inclined surface 30 of the reflecting member 3. The laser elements 2a, 2b, and 2c respectively emit laser beams L1, L2, and L3.

The laser beams L1, L2, and L3 together form the laser light L emitted from the laser oscillation unit 2. The laser elements 2a, 2b, and 2c are arranged parallel to each other on the same plane. Thus, the laser beams L1, L2, and L3 each travel in one predetermined direction. The laser beams L1, L2, and L3 each travel in a direction along the principal surface 1a, and are reflected upward by the inclined surface 30, which will be described below. In the present embodiment, the laser beams L1, L2, and L3 are incident on the inclined surface 30 at an incident angle of 45 degrees and emitted at an emission angle of 45 degrees, but are not limited to this.

In the present embodiment, the laser elements 2a, 2b, and 2c each include a group III-V semiconductor that emits laser light L. When, for example, the group III-V semiconductor is GaAs, the laser elements have a coefficient of thermal expansion of about $5.7 \times 10^{-6}$/K. The coefficient of thermal expansion of the substrate 1, which is made of Si, is in the range of $2.6 \times 10^{-6}$/K to $8.8 \times 10^{-6}$/K. Thus, the difference between the coefficient of thermal expansion of the laser oscillation unit 2 and the coefficient of thermal expansion of the substrate 1 is not very large.

Accordingly, shear force applied to the adhesive 9 due to heat generated by the laser oscillation unit 2 is not very large. Therefore, shear fracture of the adhesive 9 does not easily occur due to heat generated by the laser oscillation unit 2. The material of the substrate 1 may be a material such as AlN that has a coefficient of thermal expansion close to the coefficient of thermal expansion of the laser oscillation unit 2 including the laser elements which each include the group III-V semiconductor, and that has a relatively high thermal conductivity.

As described above, the substrate 1 and the laser oscillation unit 2 are fixed to each other with only the adhesive 9 interposed therebetween. Therefore, heat is efficiently transmitted from the laser elements 2a, 2b, and 2c that form the laser oscillation unit 2 to the substrate 1. Thus, the heat dissipation performance of the laser oscillation unit 2 is increased. Accordingly, the laser elements 2a, 2b, and 2c can be disposed parallel to each other and as close to each other as possible. As a result, the overall power density of the laser light L including the laser beams L1, L2, and L3 can be increased. In addition, the overall width of the laser light L including the laser beams L1, L2, and L3 in plan view can be reduced.

The inclined surface 30 of the reflecting member 3 may be formed of a single continuous flat surface of a single material. Accordingly, variations in the orientation of the inclined surface 30 with respect to the direction in which the laser beams L1, L2, and L3 travel is less than that when the inclined surface 30 is formed of a plurality of flat surfaces that are separated from each other. In addition, the distances between adjacent ones of the laser elements 2a, 2b, and 2c can be reduced. As a result, the size of the laser device 100 can be reduced.

The reflecting member 3 includes a base portion 3b having an inclined surface that is inclined with respect to the principal surface 1a and a reflecting layer 3a that extends along the inclined surface of the base portion 3b. The reflecting layer 3a is positioned to face the emission surfaces 20a of the laser elements 2a, 2b, and 2c. In the present embodiment, the reflecting layer 3a is a thin film in which about 10 to 20 silver atoms are stacked on the inclined surface of the base portion 3b of the reflecting member 3. The inclined surface 30 is a surface of the silver thin film, and therefore has a high reflectance. Silver has a high elastic modulus, and therefore serves to reduce aberrations in the laser light L. The inclined surface 30 may be a flat surface of any material as long as the inclined surface 30 is positioned such that the entirety of the laser light L, that is, all of the laser beams L1, L2, and L3, can be reflected.

As described above, the reflecting member 3 includes the inclined surface 30 that is inclined with respect to the principal surface 1a. The inclined surface 30 reflects the laser light L emitted from the emission surface 20a upward, more specifically, in a direction perpendicular to the principal surface 1a. At least a portion of the inclined surface 30 is positioned in a space inside the recess 7. The portion of the inclined surface 30 disposed in the space inside the recess 7 reflects at least a portion of the laser light L in the space inside the recess 7 below the principal surface 1a of the substrate 1.

According to the above-described laser device 100, the laser light L is reflected by using the space inside the recess 7. Therefore, the emission surfaces 20a of the laser oscillation unit 2 from which the laser light L is emitted can be disposed near the principal surface 1a. Accordingly, heat generated by the laser oscillation unit 2 can be efficiently transmitted to the substrate 1. As a result, there is less reduction in the efficiency of emission of the laser light L. Thus, the efficiency of emission of the laser light L can be increased.

In addition, even when the laser light L diverges as the laser light L travels along the principal surface 1a of the substrate 1, the laser light L does not reach the principal surface 1a of the substrate 1. As a result, loss in energy of the laser light L that occurs when the laser light L reaches the substrate 1 can be prevented.

Furthermore, distortion of the far-field pattern of the laser light L can be reduced.

According to the present embodiment, the recess 7 has a bottom surface 7b that is parallel to the principal surface 1a of the substrate 1. Therefore, the reflecting member 3 can be easily placed on the bottom surface 7b so that the inclined surface 30 is at a desired angle with respect to the emission surfaces 20a of the laser oscillation unit 2. One reason for this is that when the bottom surface 7b and the principal surface 1a are parallel to each other, the reflecting member 3 can be more easily bonded to the bottom surface 7b with an adhesive metal or the like than when the bottom surface 7b is inclined with respect to the principal surface 1a. Another reason is that when the bottom surface 7b and the principal surface 1a are parallel to each other, the bottom surface 7b is parallel to a horizontal plane, so that the reflecting member 3 and the substrate 1 can be stably fixed together.

In the above description, the term "parallel" does not necessarily mean parallel in a mathematical sense, and an error of about ±1° is allowed. However, the bottom surface 7b may be inclined with respect to the principal surface 1a as long as the inclined surface 30 can be provided such that each of the laser beams L1, L2, and L3 that form the laser light L travels in one desired direction.

The reflecting member 3 and the substrate 1 are made of different materials. Therefore, the inclined surface 30 can be more easily formed in a desired shape than when the inclined surface 30 is formed by processing the substrate 1. In addition, the inclined surface 30 can be formed so that the reflectance thereof is higher than the reflectance of the substrate 1. In addition, the material of the substrate 1 can be selected from a wide range of choices.

The cover member 4 may be attached to the substrate 1 so as to cover the laser oscillation unit 2 and the principal surface 1a. The cover member 4 includes a light transmitting portion 4a that transmits the laser light L reflected by the inclined surface 30. In the present embodiment, the entirety of the cover member 4 is the light transmitting portion 4a. However, a portion of the cover member 4 other than an upper wall portion that transmits the laser light L, that is, a side wall portion of the cover member 4, may be formed of an opaque material.

The laser device 100 may be configured such that a gap between the substrate 1 and the cover member 4 is sealed with a sealing member. As a result, the space surrounding the laser oscillation unit 2 is sealed. When moisture is present in the space surrounding the laser oscillation unit 2, the operational performance of the laser oscillation unit 2 may be degraded over time. Therefore, the space surrounded by the substrate 1 and the cover member 4 may be filled with dry air.

The laser oscillation unit 2 projects from a position above a side surface 7a of the recess 7 to a position above the bottom surface 7b of the recess 7. Accordingly, the emission surfaces 20a are positioned above the space inside the recess 7. As a result, even when the emission surfaces 20a are positioned near the principal surface 1a, a lower portion of the laser light L that diverges as the laser light L travels along the principal surface 1a does not reach the substrate 1. In addition, reduction in energy of the laser light L and distortion of the far-field pattern due to the substrate 1 can be prevented.

As is clear from the shape of the reflecting member 3 illustrated in FIG. 2, the height of the lower end of the reflecting layer 30 may differ from the height of the bottom surface of the reflecting member 3 at an end adjacent to the reflecting layer 30. In other words, the reflecting layer 30 may be above the bottom surface of the reflecting member 3. Accordingly, even when a bonding metal, such as AuSn or Ag, used to fix the reflecting member 3 to the substrate 1 flows outward from the bottom surface of the reflecting member 3, the reflecting layer 30 is prevented from being covered with the bonding metal. Thus, adverse effects on the reflectance of the reflecting layer 30 are prevented.

In addition, since the recess 7 is provided in the substrate 1 so that the laser light L does not travel downward beyond the lower end of the reflecting layer 30, the path of the laser light L can be changed without loss in energy of the laser light L.

In addition, since spreading of molten metal used to fix the reflecting member 3 is permissible to some extent, the design flexibility of the reflecting member 3 that are formed to control spreading of the bonding metal and a metal pattern that is formed on the surface of the substrate 1 can be increased. For example, the metal patterns are not necessarily formed in the region inside the outer periphery of the reflecting member 3, and may instead be formed outside the reflecting member 3.

The laser elements 2a, 2b, and 2c illustrated in FIG. 1 may include a red laser element 2a that emits a red laser beam L1, a blue laser element 2b that emits a blue laser beam L2, and a green laser element 2c that emits a green laser beam L3. In this case, the blue laser element 2b may be disposed between the red laser element 2a and the green laser element 2c. The colors of the laser beams emitted by the laser elements and the number of laser elements are not limited to this, and may be any colors and numbers. The order in which the plurality of laser elements 2a, 2b, 2c are arranged is not limited to this, and may be arranged in any order.

Second Embodiment

A laser device 100 according to a second embodiment will be described with reference to FIG. 3. In the following description, structures of the laser device 100 of the present embodiment similar to those of the laser device 100 of the first embodiment are basically not described. The laser device 100 of the present embodiment differs from the laser device 100 of the first embodiment in the following points.

Figure 3:
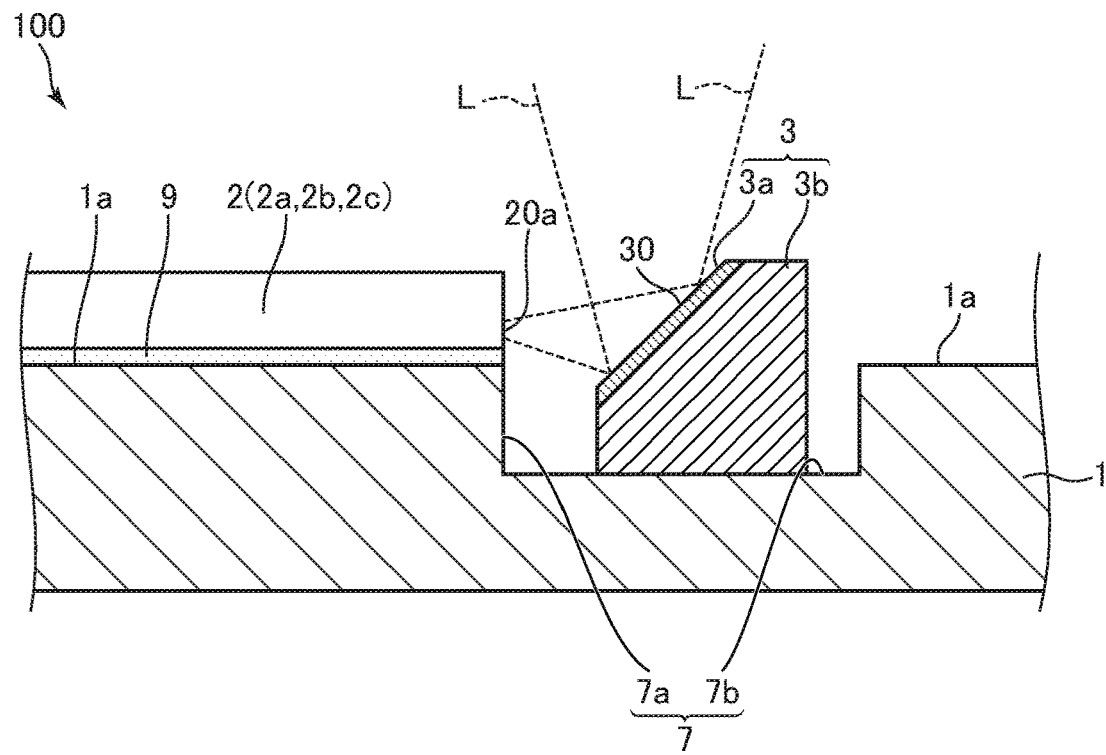
FIG. 3 is a vertical sectional view of a main part of a laser device according to a second embodiment.

As illustrated in FIG. 3, the emission surfaces 20a may be flush with the side surface 7a of the recess 7. Also in this case, even when the emission surfaces 20a are positioned near the principal surface 1a, the laser light L can be reliably prevented from reaching the substrate 1.

Third Embodiment

A laser device 100 according to a third embodiment will be described with reference to FIG. 4. In the following description, structures of the laser device 100 of the present embodiment similar to those of the laser device 100 of the first embodiment are basically not described. The laser device 100 of the present embodiment differs from the laser device 100 of the first embodiment in the following points.

Figure 4:
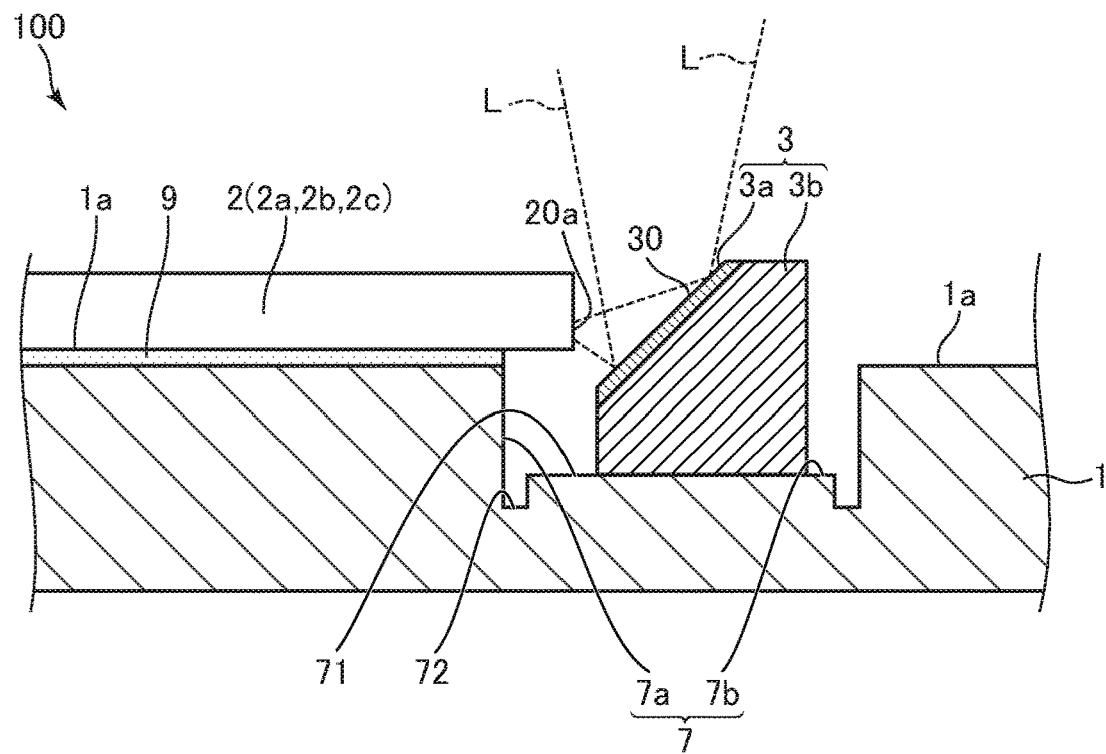
FIG. 4 is a vertical sectional view of a main part of a laser device according to a third embodiment.

As illustrated in FIG. 4, the reflecting member 3 is fixed to the bottom surface 7b of the recess 7. The bottom surface 7b may include a central portion 71 and a peripheral portion 72. The central portion 71 is a flat surface that is parallel to the principal surface 1a. The bottom surface of the reflecting member 3 is fixed to the central portion 71 with an adhesive metal or the like. The peripheral portion 72 surrounds the central portion 71 in a plan view (not shown). The peripheral portion 72 is recessed deeper from the principal surface 1a of the substrate 1 than the central portion 71 is, so that the peripheral portion 72 is below the central portion 71.

According to the above-described laser device 100 of the present embodiment, the peripheral portion 72 can be reliably prevented from being positioned above the central portion 71 due to processing errors of the recess 7. As a result, the recess 7 can be designed to have a small size in a plan view. As a result, the size of the principal surface 1a of the substrate 1 can be reduced. Accordingly, the size of the laser device 100 can be reduced.

The above configuration will be described in more detail. The substrate 1 is machined by using a mask to form the recess 7 that is recessed to a predetermined depth from the principal surface 1a of the substrate 1. At this time, a peripheral portion of the recess 7 near the boundary between the side surface 7a and the bottom surface 7b may be rounded.

Accordingly, in a plan view, the region surrounded by the outline of the flat central portion 71 of the bottom surface 7b of the recess 7 is smaller than the region surrounded by the outline of the recess 7 on a plane coinciding with the principal surface 1a. Accordingly, the size of the reflecting member 3 in a plan view is to be reduced in accordance with the size of the region surrounded by the outline of the central portion 71 of the bottom surface 7b. Alternatively, the outline of the recess 7 on the plane coinciding with the principal surface 1a is to be enlarged to a size considerably greater than the size of the reflecting member 3 in a plan view.

When the size of the reflecting member 3 in a plan view is reduced in accordance with the size of the region surrounded by the outline of the flat central portion 71 of the bottom surface 7b, a portion of the laser light L may pass through a position outside the inclined surface 30 and fail to be reflected in the desired direction. In this case, energy of the portion of the laser light L will be lost. When the outline of the recess 7 on the plane coinciding with the principal surface 1a is enlarged to a size considerably greater than the size of the reflecting member 3 in a plan view, the size of the laser device 100 is increased.

Accordingly, the size of the region surrounded by the outline of the recess 7 in the substrate 1 on the plane coinciding with the principal surface 1a may be reduced. In other words, rounding of the peripheral portion of the bottom surface 7b near the boundary between the bottom surface 7b and the side surface 7a in cross-sectional view may be reduced. Accordingly, in the present embodiment, the peripheral portion 72 is recessed deeper than the central portion 71 is so that the peripheral portion 72 of the bottom surface 7 is below the central portion 71 of the bottom surface 7.

In this case, the central portion 71 with which the bottom surface of the reflecting member 3 is in contact is flat over the entire region thereof, so that the accuracy with which the reflecting member 3 is attached to the substrate 1 is not reduced even when a space is provided between the peripheral portion 72 and the bottom surface of the reflecting member 3.

Fourth Embodiment

A laser device 100 according to a fourth embodiment will be described with reference to FIG. 5. In the following description, structures of the laser device 100 of the present embodiment similar to those of the laser device 100 of the first embodiment are basically not described. The laser device 100 of the present embodiment differs from the laser device 100 of the first embodiment in the following points.

Figure 5:
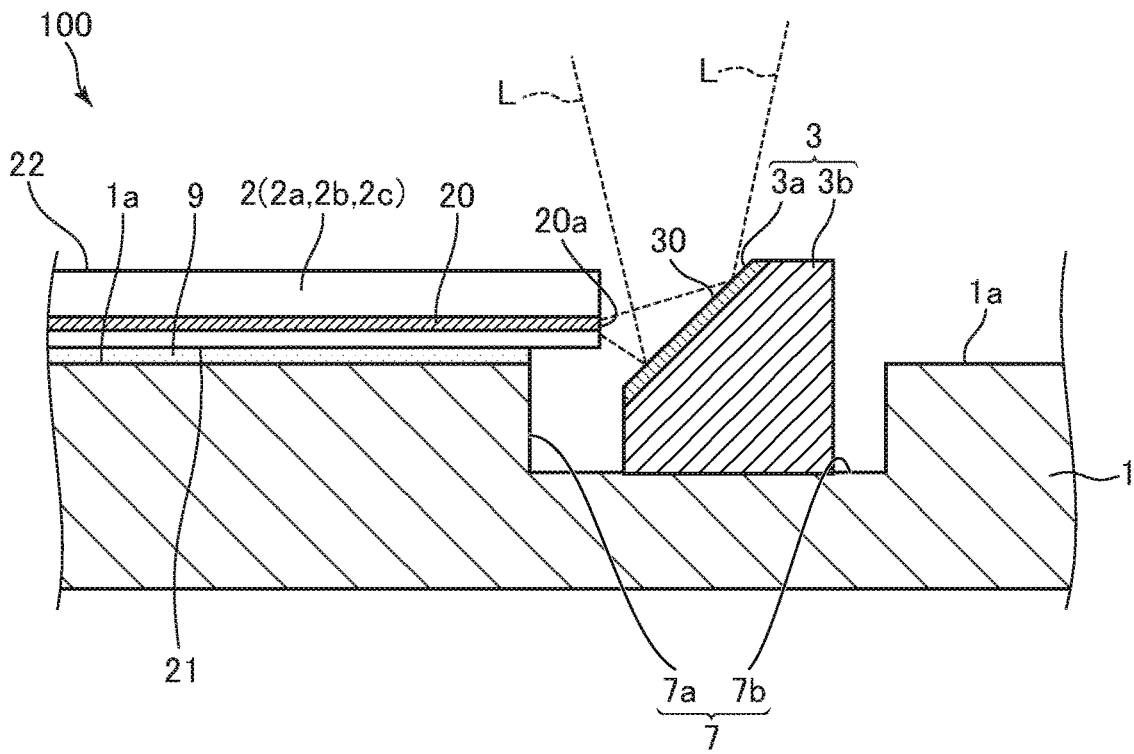
FIG. 5 is a vertical sectional view of a main part of a laser device according to a fourth embodiment.

As illustrated in FIG. 5, the laser oscillation unit 2 may include the laser elements 2a, 2b, and 2c which are each formed of a semiconductor having a multilayer structure including a light emitting layer 20 having the emission surface 20a. The multilayer structure of each of the laser elements 2a, 2b, and 2c includes a first outer principal surface 21 that is relatively close to the light emitting layer 20 and a second outer principal surface 22 that is relatively far from the light emitting layer 20.

The first outer principal surface 21 is fixed to the principal surface 1a with the adhesive 9 interposed therebetween. Each of the laser elements 2a, 2b, and 2c may instead be fixed to the principal surface 1a of the substrate 1 so that the first outer principal surface 21 thereof is directly in contact with the principal surface 1a. In this case, the emission surfaces 20a can be easily brought closer to the principal surface 1a.

The above configuration will now be described in more detail.

Each of the laser elements 2a, 2b, and 2c is provided such that the light emitting layer 20 thereof extends along the principal surface 1a of the substrate 1. Therefore, the pn junction surface of each of the laser elements 2a, 2b, and 2c also extends along the principal surface 1a of the substrate 1. The pn junction surface of the light emitting layer 20 is closer to the first outer principal surface 21 than to the second outer principal surface 22.

In this specification, the above-described structure is referred to as a junction-down structure. More specifically, in this specification, a junction-down structure is a structure in which the first outer principal surface 21 of each of the laser elements 2a, 2b, and 2c that is close to the light emitting layer (active layer) 20 is fixed to the substrate 1 with the adhesive 9 interposed therebetween. Therefore, heat generated by the light emitting layer 20 is efficiently conducted to the first outer principal surface 21 and transmitted to the substrate 1. As a result, heat generated by each of the laser elements 2a, 2b, and 2c is efficiently dissipated to the outside from the substrate 1 of the laser device 100.

This advantage can be enhanced when the laser elements 2a, 2b, and 2c are fixed to the substrate 1 having a large area with the adhesive 9 interposed therebetween. This is because the substrate 1, which has a large area and high heat dissipation performance, can be disposed very near the light emitting layers 20 of the laser elements 2a, 2b, and 2c that serve as heat sources. Accordingly, heat generated by each of the laser elements 2a, 2b, and 2c can be efficiently dissipated in directions along the plane of the substrate 1.

In addition, according to the above-described junction-down structure, the emission surfaces 20a can be positioned near the principal surface 1a of the substrate 1. When the emission surfaces 20a are provided near the principal surface 1a of the substrate 1, the emission surfaces 20a may be positioned above the recess 7 to reliably prevent the laser light L from reaching the substrate 1. In other words, each of the laser elements 2a, 2b, and 2c may be arranged to project from the side surface 7a of the recess 7 to a position above the space inside the recess 7.

According to the present embodiment, the laser elements 2a, 2b, and 2c respectively emit the laser beams L1, L2, and L3 in the same direction. In this case, the blue laser element 2b that emits the blue laser beam L2 may be disposed between the red laser element 2a that emits the red laser beam L1 and the green laser element 2c that emits the green laser beam L3.

The reason for this is that the blue laser element 2b is more heat resistant than the red laser element 2a and the green laser element 2c, and therefore causes the least degradation due to heat received from the laser elements on both sides thereof, which are the red laser element 2a and the green laser element 2c. The light emission efficiency of the blue laser element 2b is higher than those of the red laser element 2a and the green laser element 2c.

The light emitting layers 20 of the blue laser element 2b and the green laser element 2c each include a group III-V nitride semiconductor. As the In composition ratio of each light emitting layer 20 decreases, the crystallinity of the light emitting layer 20 increases. The In composition ratio of the light emitting layer 20 included in the blue laser element 2b is lower than that of the light emitting layer 20 included in the green laser element 2c. Therefore, the blue laser element 2b is superior to the green laser element 2c in terms of laser characteristics such as light emission efficiency and power efficiency. The reason for this will be described below.

The ease of bonding between In and N that form InN and the ease of bonding between Ga and N that form GaN greatly vary depending on heat. When the temperature is constant, the ease of separation between In and N that form InN in the light emitting layer 20 including InN is greater than the ease of separation between Ga and N that form GaN in the light emitting layer 20 including GaN. Therefore, the light emitting layer 20 including InN is to be grown at a temperature considerably lower than the growth temperature optimum for the light emitting layer 20 including GaN.

Accordingly, a ternary mixed crystal of InGaN, which is generally used as the material of the light emitting layers 20, is to be grown at a temperature of about 700° C. to 800° C., which is considerably lower than the growth temperature of GaN, which is about 1000° C., even when the In composition ratio is low. As the In composition ratio of each light emitting layers 20 increases, the growth temperature of the light emitting layers 20 is to be reduced to a temperature as low as possible in the range of 700° C. to 800° C.

In general, InGaN having a high In composition ratio has a lower crystallinity than does InGaN having a low In composition ratio. This is because, with regard to InGaN having a high In composition ratio, the surface migration length of In or Ga is reduced due to a reduction in the crystal growth temperature and it is therefore difficult to obtain a high-quality crystal with high regularity and few defects. The efficiency of emission of the laser light L from the light emitting layers 20 is presumably reduced when the material of the light emitting layers 20 has a low crystallinity.

The red laser element 2a mainly includes a phosphorous-based group III-V semiconductor. When a phosphorous-based group III-V semiconductor is used, it is difficult to increase the difference between the band gap of a p-type clad layer that serves as a barrier against the movement of electron carriers in the light emitting layer 20 and the band gap of the light emitting layer 20. Therefore, when the operation temperature of the red laser element 2a is increased, the electron carriers in the light emitting layer 20 are not effectively trapped in the light emitting layer 20. This is because, as described above, the height of the energy barrier of the p-type clad layer that prevents the electron carriers that are present in the light emitting layer 20 and energized by heat from being discharged.

Accordingly, the electron carriers are discharged to the outside of the light emitting layer 20, and therefore the light emission efficiency of the light emitting layer 20 is reduced. Thus, the temperature characteristics of the red laser element 2a are inferior to those of the blue laser element 2b.

The reason why it is difficult to increase the above-described difference between the band gap of the p-type clad layer and the band gap of the light emitting layer 20 is that the difference in band gap between GaP and AlP is about 0.2 eV and the difference in band gap between AlP and InP is as low as about 1 eV. Accordingly, the variable range of the band gap of the phosphorous-based group III-V semiconductor is narrower than the variable range of the band gap of, for example, the gallium-based group III-V semiconductor.

The combination of the substrate 1 made of Si and the laser elements made of GaAs has previously been used. The coefficient of thermal expansion of the substrate 1 made of Si is about $3.1 \times 10^{-6}$/K. The coefficient of thermal expansion of the laser elements made of GaAs is about $5.7 \times 10^{-6}$/K. In this case, the difference in coefficient of thermal expansion is about $2.6 \times 10^{-6}$/K. With such a difference in coefficient of thermal expansion, the above combination of the substrate 1 and the laser elements is appropriate.

When laser elements made of GaN are used, GaN has an elastic modulus higher than that of GaAs. In this case, the laser elements are not easily deformed by stress generated due to the difference in coefficient of thermal expansion between the substrate 1 and the laser elements. Therefore, when the combination of the laser elements made of GaN and the substrate 1 made of Si is used, the difference in coefficient of thermal expansion may be greater than that when the combination of the laser elements made of GaAs and the substrate 1 made of Si is used.

Accordingly, the tolerance reference for the difference in coefficient of thermal expansion between the substrate 1 and the laser elements may be $2.6 \times 10^{-6}$/K, which is the difference in coefficient of thermal expansion when the combination of the laser elements made of GaAs and the substrate 1 made of Si is used. The difference in coefficient of thermal expansion between the substrate 1 and the laser oscillation unit 2 may instead be about $3.2 \times 10^{-6}$/K, which is slightly greater than about $2.6 \times 10^{-6}$/K. Thus, the coefficient of thermal expansion of the substrate 1 may be in the range of $2.6 \times 10^{-6}$/K to $8.8 \times 10^{-6}$/K. Examples of the material of the substrate 1 having a coefficient of thermal expansion in the above-described range include Si, SiC, W, AlN, Cu-Diamond, CuW, Mg—SiC, and Cu—Mo.

Fifth Embodiment

A laser device 100 according to a fifth embodiment will be described with reference to FIG. 6. In the following description, structures of the laser device 100 of the present embodiment similar to those of the laser device 100 of the first embodiment are basically not described. The laser device 100 of the present embodiment differs from the laser device 100 of the first embodiment in the following points.

Figure 6:
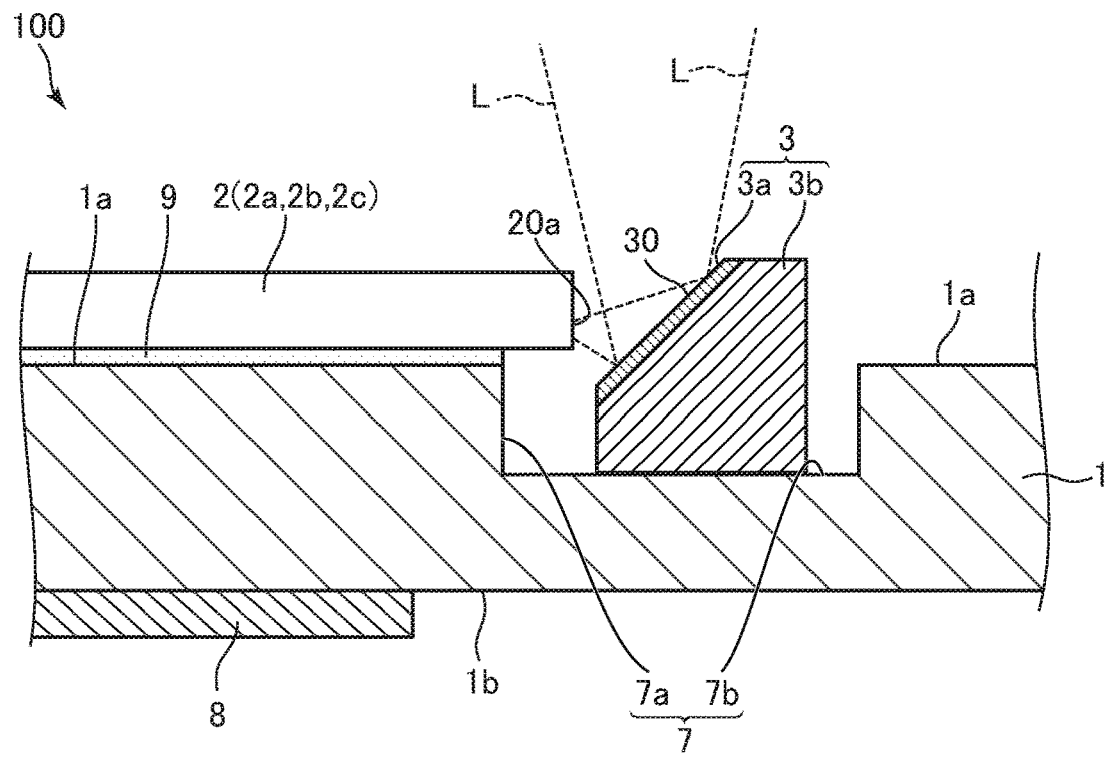
FIG. 6 is a vertical sectional view of a main part of a laser device according to a fifth embodiment.

As illustrated in FIG. 6, the substrate 1 includes a back surface 1b at a side opposite to the principal surface 1a. The laser device 100 may further include a heat dissipating member 8 on the back surface 1b at a position where the heat dissipating member 8 faces the laser oscillation unit 2, the heat dissipating member 8 having a coefficient of overall heat transmission higher than a coefficient of overall heat transmission of the substrate 1. The heat dissipating member 8 may be made of, for example, a metal material.

According to this structure, a material having high heat dissipation performance, such as a metal material, is present at a position near the laser elements 2a, 2b, and 2c. Therefore, heat generated by the laser oscillation unit 2 is dissipated to the outside through the heat dissipating member 8. Since the coefficient of overall heat transmission of the heat dissipating member 8 is higher than the coefficient of overall heat transmission of the substrate 1, dissipation of heat from the laser oscillation unit 2 is promoted by the heat dissipating member 8. Therefore, the temperature increase of each of the laser elements 2a, 2b, and 2c in operation can be effectively reduced. As a result, there is less reduction in the efficiency of emission of the laser light L due to heat generated by the laser oscillation unit 2. Accordingly, the efficiency of emission of the laser light L can be further increased.

Sixth Embodiment

A laser device 100 according to a sixth embodiment will be described with reference to FIGS. 7 and 8. In the following description, structures of the laser device 100 of the present embodiment similar to those of the laser device 100 of the first embodiment are basically not described. The laser device 100 of the present embodiment differs from the laser device 100 of the first embodiment in the following points.

Figure 7:
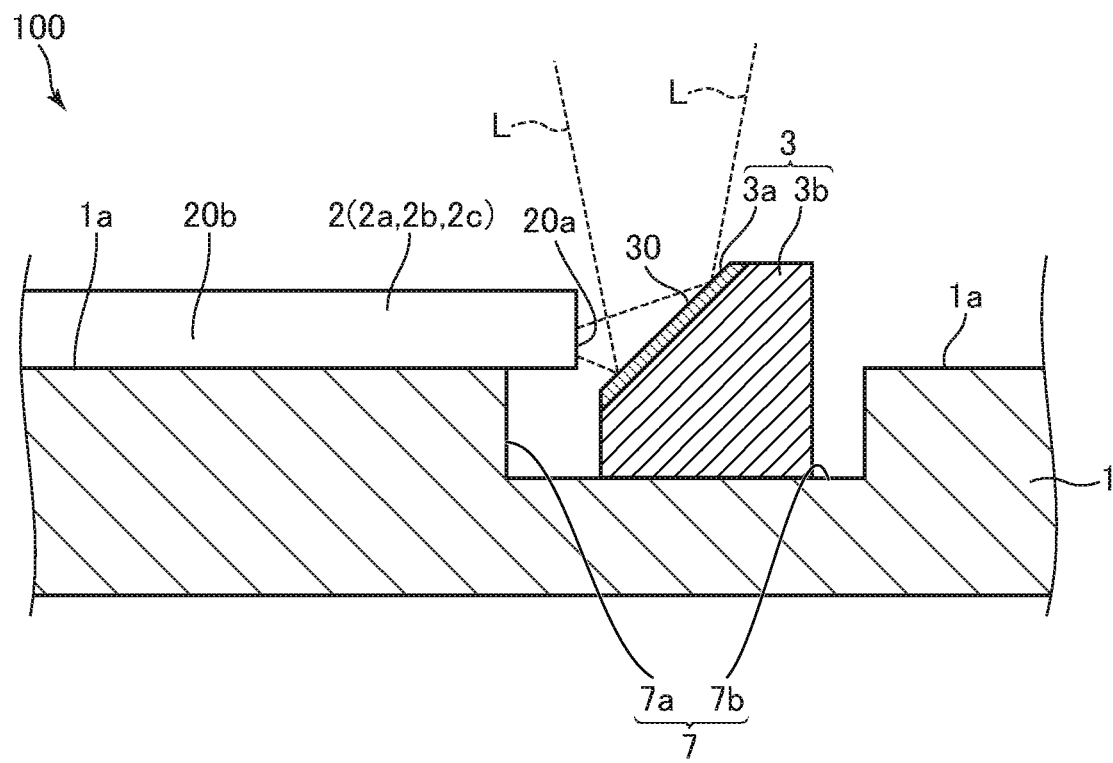
FIG. 7 is a vertical sectional view of a main part of a laser device according to a sixth embodiment.
Figure 8:
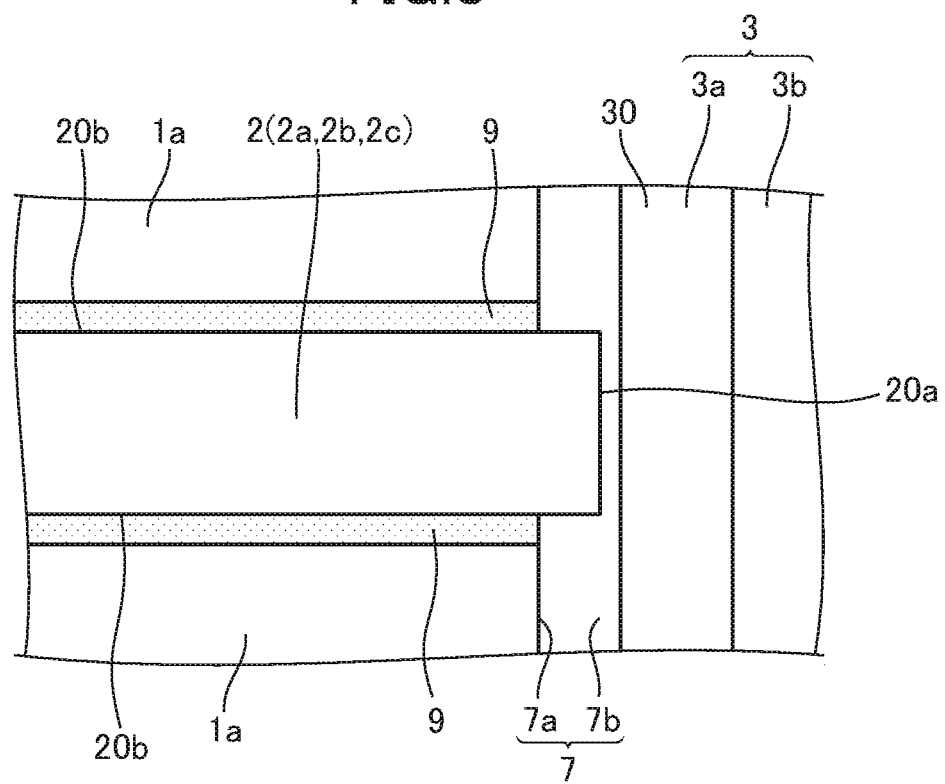
FIG. 8 is a plan view of the main part of the laser device according to the sixth embodiment.

As illustrated in FIGS. 7 and 8, the laser oscillation unit 2 may be fixed to the principal surface 1a in direct contact therewith. In this case, the adhesive 9 may be applied along the corners between the principal surface 1a of the substrate 1 and side surfaces 20b of the laser element 2b to join the principal surface 1a of the substrate 1 to the side surfaces 20b of the laser element 2b. In this case, heat generated by the laser oscillation unit 2 can be most efficiently transmitted to the substrate 1. Thus, heat generated by the laser oscillation unit 2 can be more efficiently dissipated to the outside of the laser device 100.

A method for manufacturing the above-described laser device 100 will now be described.

First, the substrate 1 made of AlN and having wiring patterns formed on the principal surface 1a thereof is prepared. Next, a protection film is placed on the principal surface 1a so as to cover the principal surface 1a over a region other than the region where the recess 7 is to be formed. After that, a portion of the substrate 1 is selectively removed to a predetermined depth from the principal surface 1a by blasting in a region other than the region in which the principal surface 1a is covered with the protection film. Thus, the recess 7 having the predetermined depth from the principal surface 1a is formed in the substrate 1 in the region where the principal surface 1a is not covered with the protection film.

Next, the laser elements 2a, 2b, and 2c are pressed against the principal surface 1a while the adhesive 9 is present between each of the laser elements 2a, 2b, and 2c and the principal surface 1a in an atmosphere at about 300° C. to 400° C. In this state, the adhesive 9 is solidified. Thus, the laser elements 2a, 2b, and 2c are fixed to the principal surface 1a. The adhesive 9 is, for example, a metal-based adhesive containing AuSn as a main component.

After that, the laser elements 2a, 2b, and 2c are electrically connected to the wiring patterns on the substrate 1 made of AlN by, for example, gold wires and ball bonders. Next, the reflecting member 3 is attached to the bottom surface 7b of the recess 7 with an adhesive made of, for example, a metal such as Au, Ni, Cr, or Ag in an atmosphere at about 150° C. to 250° C.

Next, the cover member 4 made of a light transmitting material, such as glass, is attached to the principal surface 1a of the substrate 1 with an adhesive in an atmosphere at a temperature of about 200° C. to 300° C. In this case, the material of the adhesive may contain a metal such as Ag, Au, Sn, or Ni as a main component thereof. The space surrounded by the substrate 1 and the cover member 4 may be filled with dry air from which moisture is removed. To achieve this, the substrate 1 having the wiring patterns to which the laser elements 2a, 2b, and 2c are electrically connected is placed in a chamber filled with dry air. In this state, the cover member 4 is bonded to the substrate 1 by using working gloves attached to the chamber.

Example 1

Figure 9:
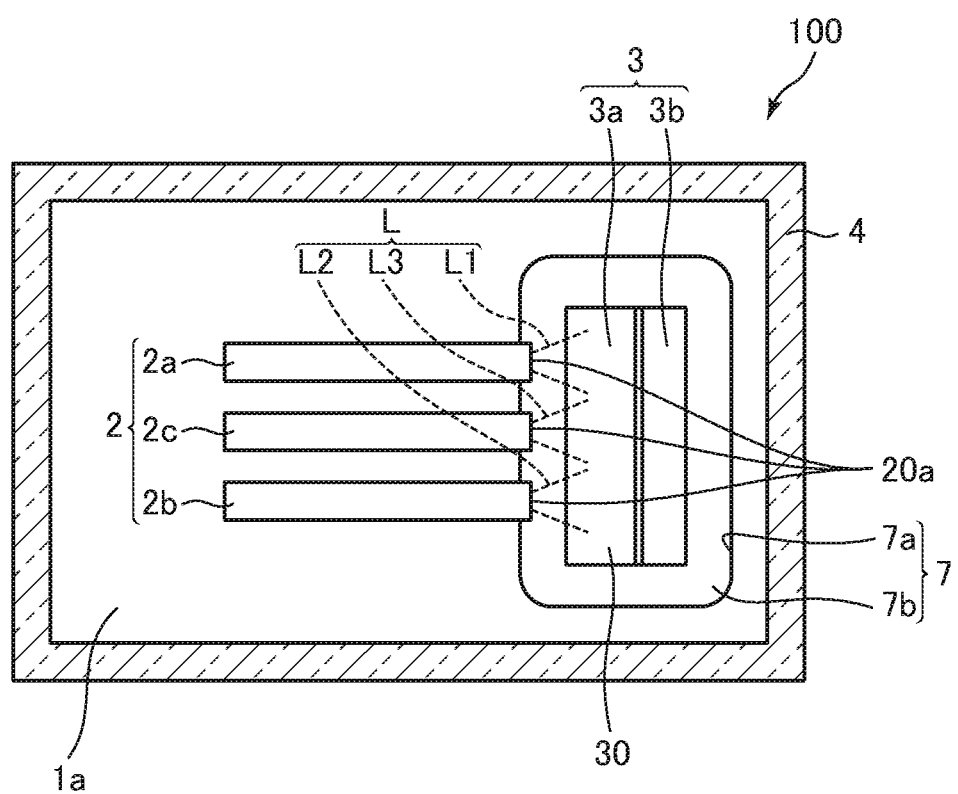
FIG. 9 is a horizontal sectional view of a laser device according to Example 1 and Example 2.

As shown in FIG. 9, a laser device 100 of Example 1 includes a red laser element 2a, a green laser element 2c, and a blue laser element 2b arranged parallel to each other in that order and bonded to a principal surface 1a of a substrate 1 with an adhesive 9. In this case, the red laser element 2a, the green laser element 2c, and the blue laser element 2b are each bonded to the substrate 1 in a junction-down structure. The substrate 1 has a recess 7, and a reflecting member 3 is fixed to a bottom surface 7b of the recess 7.

A laser device 100 of Comparative Example 1 includes a red laser element 2a, a green laser element 2c, and a blue laser element 2b arranged parallel to each other in that order and fixed to a flat principal surface 1a of a substrate 1 having no recess 7 with a sub-mount made of AlN interposed therebetween. Also in this case, the red laser element 2a, the green laser element 2c, and the blue laser element 2b are each fixed to the substrate 1 in a junction-down structure. The substrate 1 has no recess 7, and a reflecting member 3 is fixed to the principal surface 1a.

The laser device 100 of Example 1 will be compared with the laser device of Comparative Example 1. When, for example, the ambient temperature is 60° C. and the operating current is 150 mA, the output of the laser light L from the red laser element 2a is 50 mW in Example 1, in which no sub-mount is provided, and is 46 mW in Comparative Example 1, in which the sub-mount is provided. Thus, according to the laser device of Example 1, the output of the laser light L is about 10% higher than that of the laser device of Comparative Example 1.

The above experiment shows that the laser device 100 of Example 1, which has no sub-mount, is capable of emitting the laser light L at a higher output level than the laser device of Comparative Example 1, which has the sub-mount.

Example 2

As shown in FIG. 9, a laser device 100 of Example 2 includes a red laser element 2a, a green laser element 2c, and a blue laser element 2b arranged parallel to each other in that order and bonded to a principal surface 1a of a substrate 1 with an adhesive 9. Also in Example 2, the red laser element 2a, the green laser element 2c, and the blue laser element 2b are each bonded to the substrate 1 in a junction-down structure. The substrate 1 has a recess 7, and a reflecting member 3 is fixed to a bottom surface 7b of the recess 7.

A laser device 100 of Comparative Example 2 includes a red laser element 2a, a green laser element 2c, and a blue laser element 2b fixed in such a manner that the red laser element 2a, the green laser element 2c, and the blue laser element 2b are arranged parallel to each other in that order. In the laser device 100 of Comparative Example 2, the red laser element 2a, the green laser element 2c, and the blue laser element 2b are each fixed to a flat principal surface 1a of a substrate 1 having no recess 7 with a sub-mount made of AlN interposed therebetween. In this case, the red laser element 2a, the green laser element 2c, and the blue laser element 2b are fixed to the substrate 1 in a junction-down structure, a junction-up structure, and a junction-up structure, respectively. The substrate 1 has no recess 7, and a reflecting member 3 is fixed to the principal surface 1a.

To maintain the operation temperature of the laser device of Example 2 having no sub-mount at 60° C., the surrounding temperature was set to 18.5° C., and the output of the blue laser element 2b was 80 mW in this case. To maintain the operation temperature of the laser device of Comparative Example 2 having the sub-mount at 60° C., the surrounding temperature was set to 1.5° C., and the output of the blue laser element 2b was 80 mW in this case.

To maintain the operation temperature of the laser device of Example 2 having no sub-mount at 60° C., the surrounding temperature was set to 25° C., and the output of the green laser element 2c was 40 mW in this case. To maintain the operation temperature of the laser device of Comparative Example 2 having the sub-mount at 60° C., the surrounding temperature was set to 16° C., and the output of the green laser element 2c was 40 mW in this case.

Thus, according to Comparative Example 2, in which the sub-mount is provided, the surrounding ambient temperature is to be set to a temperature lower than that for the laser device of Example 2, which has no sub-mount, to achieve the same operation temperature for the laser device. This shows that the heat dissipation performance of a laser device having no sub-mount is higher than that of a laser device having a sub-mount.

General Problems of Laser Devices

In recent years, it has become possible to manufacture a blue laser element or a green laser element that mainly includes a group III-V nitride semiconductor for a semiconductor laser device. In addition to a red laser element that mainly includes a group III-V semiconductor containing arsenic or phosphorus that has recently been used, it has also become possible to use a green laser element and a blue laser element. As a result, semiconductor laser elements of three primary colors for achieving a full-color display all exist. Therefore, semiconductor lasers may be used as light sources for a display.

Semiconductor laser elements are also used in application products with high outputs, such as a laser processing machine. For example, to realize a smaller laser device including semiconductor laser elements, a laser device has been proposed in which a plurality of laser elements are arranged in parallel to each other in the assembly of a substrate and a cover member and in which the laser elements serve as light sources.

In the case where a plurality of laser beams are output in the same direction by a plurality of laser elements, the distances between the laser elements may be reduced to reduce the size of the laser device. However, when the distances between the laser elements are reduced, the performances of the laser elements are degraded due to heat generated by the laser elements.

Comparison Between Laser Device 100 of Each Embodiment and Laser Device Disclosed in Patent Document 1

To solve the above-described general problems of laser devices, U.S. Pat. No. 8,897,327 (Patent Document 1), for example, discloses a laser device in which a plurality of laser elements are arranged to face two inclined surfaces of a reflecting member having an isosceles triangular shape. Thus, distances between the laser elements are increased.

In a laser device in which the travelling direction of laser light emitted from emission surfaces of laser elements is changed by a reflecting member, the laser elements generate heat when high-output laser light is emitted. In such a case, the laser light emission efficiency is reduced. Therefore, heat generated by the laser elements may be dissipated to the outside through a substrate. Accordingly, the laser elements are mounted on sub-mounts having a high thermal conductivity. However, when the sub-mounts are placed between the substrate and the laser elements, the effective volume of the space that contributes to improving the laser characteristics of the laser device is reduced. Therefore, it becomes necessary to increase the height of the laser device. As a result, the size of the laser device is increased.

In addition, the cross-sectional area of the sub-mounts is less than that of the substrate. Therefore, even when the sub-mounts provided on the substrate have a high thermal conductivity, it is difficult for the sub-mounts to reduce a thermal resistance more effectively than does the substrate when heat generated by the laser elements is guided to the outside of the laser device. In addition, the opposing surfaces of the laser elements and the sub-mounts and the opposing surfaces of the sub-mounts and the substrate are to be fixed together by using, for example, an adhesive metal. Therefore, a thermal resistance due to the adhesive occurs at the opposing surfaces. The thermal resistance due to the adhesive metal at the boundary surfaces may serve as a factor that hinders reduction in the operation temperature of the laser elements.

In addition, three types of members, which are the substrate, the sub-mounts, and the laser elements, thermally expand. It is more difficult to reduce mechanical stresses generated in each of three types of members than to reduce mechanical stresses generated in each of two types of members. When large mechanical stresses are generated, cracks are formed in, for example, the laser elements and breakdown of the laser elements may occur.

In the case where a plurality of laser elements are mounted in a laser device, when a reflecting member is disposed between two laser elements and the two laser elements are arranged such that two emission surfaces thereof face each other, the distance between the two laser elements can be increased. Therefore, the problem that the laser light emission efficiency is reduced due to heat generated by the laser elements can be solved.

However, a substrate 1 having a large area is to be prepared to arrange two laser elements in a predetermined direction along a straight line. Therefore, the size of the laser device is increased. In addition, since two reflecting surfaces are to be provided on the reflecting member, the accuracy with which the two reflecting surfaces are disposed is to be increased to increase the laser light emission efficiency. Accordingly, the work for processing the reflecting surfaces is twice that when the accuracy of only one reflecting surface is to be increased.

In addition, since the reflecting surfaces are provided at two positions that are separated from each other, the diameter of the laser beam is increased. As a result, the directivity of the laser beam is reduced. Thus, the benefits of the laser beam is reduced. When the directivity of the laser beam is reduced or the diameter of the laser beam is increased, in the case where the laser beam is collimated or focused by a lens, tolerance ranges in the design and manufacture of the lens are narrowed.

However, according to the laser device 100 of each of the above-described embodiments, the reflecting member 3 is placed on the flat bottom surface 7b of the recess 7 in the substrate 1, and no sub-mount is provided on the substrate 1. Therefore, the problems due to the sub-mount provided on the substrate 1 do not occur.

Comparison Between Laser Device 100 of Each Embodiment and Laser Device Disclosed in Patent Document 2

To solve the above-described general problems of laser devices, Japanese Unexamined Patent Application Publication No. 2012-59898 (Patent Document 2) discloses a technology of bringing a plurality of laser-beam emitting points closer to each other by bending a plurality of waveguides for laser beams that are largely separated from each other instead of increasing the distances between the laser elements.

However, bent waveguides are complex to design and process. In addition, even when reflecting surfaces are provided at bent portions of the waveguides, reflection without optical loss is difficult to realize. In addition, reflecting surfaces that bend the laser light in a desired direction are complex and difficult to form with high accuracy. Furthermore, since the waveguides are provided in addition to other members, the area occupied by a portion that contributes to increasing the laser light emission efficiency is reduced. As a result, the size of the laser device is increased, which cancels the advantage of the laser device including the semiconductor laser elements that the size of the laser device can be reduced.

However, according to the laser device 100 of each of the above-described embodiments, since the reflecting member 3 is placed on the flat bottom surface 7b of the recess 7 in the substrate 1, the waveguides of the laser beams are not bent. Accordingly, the problem that the bent waveguides are complex to design and process do not occur.

Comparison Between Laser Device 100 of Each Embodiment and Laser Device Disclosed in Patent Document 3

To solve the above-described general problems of laser devices, Japanese Unexamined Patent Application Publication No. 2017-69241 (Patent Document 3) discloses a structure in which a substrate itself serves as a reflecting member. According to this laser device, the substrate is processed to form an inclined surface that reflects the laser light.

When the substrate itself serves as a reflecting member as in this structure, the substrate is to be made of a highly reflective material to prevent a reduction in the laser light emission efficiency. When a reflecting layer is provided on the substrate, an additional manufacturing step is to be performed.

In addition, as described above, a material having a high thermal conductivity is to be selected as the material of the reflecting layer to reduce the increase in the temperature of the laser elements. In addition, the material of the reflecting layer is to have a coefficient of thermal expansion close to the coefficient of thermal expansion of the substrate to reduce the distortion stress generated between the reflecting layer and the substrate in response to a temperature increase. There are very few materials for the reflecting layer that satisfy the above three requirements.

When the substrate is directly processed, the inclined surface that reflects the laser light is to be accurately processed, which is difficult. In addition to the problem that it is difficult to accurately process the inclined surface, there are also problems that the surface roughness of the substrate will be increased and the corners of the substrate will be rounded when the substrate is etched.

However, according to the laser device 100 of each of the above-described embodiments, the reflecting member 3 is placed on the flat bottom surface 7b of the recess 7 in the substrate 1, so that the above-described problems that occur when the reflecting surface is formed by processing the substrate or when the reflecting layer is formed directly on the substrate do not occur.

Comparison Between Laser Device 100 of Each Embodiment and Laser Device Disclosed in Patent Document 4

To solve the above-described problems, Japanese Unexamined Patent Application Publication No. 2003-188454 (Patent Document 4) discloses a laser device in which a reflecting surface that reflects laser light upward is provided on a substrate. This reflecting surface is obtained by forming a V-shaped recess in the substrate.

Also when a V-shaped recess is formed in the substrate, problems similar to those of the technology disclosed in Patent Document 3 occur. In addition, when a reflecting layer is formed on an inclined surface of the V-shaped recess and when a major portion of the reflecting layer protrudes from the V-shaped recess, the reflecting layer is difficult to fix, and it is therefore difficult to stabilize the reflecting layer.

Therefore, the depth and width of the V-shaped recess are to be determined in consideration of the size of the reflecting layer. Accordingly, there are design limitations due to the V-shaped recess. When a large V-shaped recess is to be formed, a substrate thick and large enough for the V-shaped recess is to be prepared. As a result, the size of the laser device is increased, which cancels the advantage of the semiconductor laser element that the size can be reduced.

However, according to the laser device 100 of each of the above-described embodiments, the reflecting member 3 is placed on the flat bottom surface 7b of the recess 7 in the substrate 1, so that the above-described problems due to the V-shaped recess provided in the substrate do not occur.

It should be understood by those skilled in the art that various modifications, combinations, sub-combinations and alterations may occur depending on design requirements and other factors insofar as they are within the scope of the appended claims or the equivalents thereof.

EXPLANATION OF SYMBOLS 1 substrate
1a principal surface
2 laser oscillation unit
2a red laser element
2b blue laser element
2c green laser element
3 reflecting member
3a reflecting layer
3b base portion
4 cover member
4a transmitting portion
7 recess
7a side surface
7b bottom surface
8 heat dissipating member
9 adhesive
20 light emitting layer
20a emission surface
20b side surface
21 first outer principal surface
22 second outer principal surface
30 inclined surface
71 central portion
72 peripheral portion
100 laser device
L laser light
L1 laser beam
L2 laser beam
L3 laser beam

What is claimed is:

1. The laser device comprising:
   a substrate including a principal surface and a recess provided in the principal surface;
   a laser oscillation unit fixed to the principal surface in direct contact with the principal surface or with an adhesive interposed between the laser oscillation unit and the principal surface, the laser oscillation unit having an emission surface from which laser light is emitted along the principal surface; and
   a reflecting member fixed to a bottom surface of the recess and having an inclined surface that is inclined with respect to the principal surface at a position such that the inclined surface reflects the laser light,
   wherein at least a portion of the inclined surface is positioned in a space inside the recess.

2. The laser device according to claim 1, further comprising:
   a cover member attached to the substrate to cover the laser oscillation unit and the principal surface, wherein the cover member includes a light transmitting portion that transmits the laser light reflected by the inclined surface.

3. The laser device according to claim 1, wherein the laser oscillation unit includes a plurality of laser elements that respectively emits a plurality of laser beams that form the laser light, and wherein the plurality of laser elements are arranged such that each of the plurality of laser beams is emitted in one predetermined direction.

4. The laser device according to claim 1, wherein the emission surface is positioned above the space inside the recess or is flush with a side surface of the recess.

5. The laser device according to claim 1, wherein the bottom surface includes a central portion to which the reflecting member is fixed and a peripheral portion that surrounds the central portion, and wherein the peripheral portion is below the central portion.

6. The laser device according to claim 1, wherein the laser oscillation unit includes a semiconductor laser element having a multilayer structure including a light emitting layer having the emission surface, wherein the multilayer structure includes a first outer principal surface relatively close to the light emitting layer and a second outer principal surface relatively far from the light emitting layer, and wherein the first outer principal surface and the principal surface are in direct contact with each other or are fixed to each other with the adhesive interposed therebetween.

7. The laser device according to claim 1, wherein a gap between the substrate and the cover member is sealed so that a space surrounding the laser oscillation unit is sealed.

8. The laser device according to claim 1, wherein the substrate includes a back surface at a side opposite to the principal surface, and wherein the laser device further comprises a heat dissipating member on the back surface at a position such that the heat dissipating member faces the laser oscillation unit, the heat dissipating member having a heat transmission coefficient higher than a heat transmission of the substrate.

9. The laser device according to claim 3, wherein the plurality of laser elements include a red laser element that emits a red laser beam, a green laser element that emits a green laser beam, and a blue laser element that emits a blue laser beam, and wherein the blue laser element is disposed between the red laser element and the green laser element.

10. The laser device according to claim 1, wherein the laser oscillation unit includes a group III-V semiconductor that emits the laser light, and wherein a thermal expansion coefficient of the substrate is in a range of $2.6 \times 10^{-6}$/K to $8.8 \times 10^{-6}$/K.

11. The laser device according to claim 1, wherein the inclined surface is a surface of a silver layer.

12. The laser device according to claim 1, wherein the reflecting member reflects at least a portion of the laser light in the space inside the recess.

13. The laser device according to claim 1, wherein a height of a lower end of the inclined surface of the reflecting member differs from a height of a bottom surface of the reflecting member at an end adjacent to the inclined surface.

* * * * *